United States Patent
Shin

(10) Patent No.: US 10,692,583 B2
(45) Date of Patent: Jun. 23, 2020

(54) MULTI-CHANNEL PACKAGE, AND TEST APPARATUS AND TEST METHOD OF TESTING THE SAME

(71) Applicant: Samsung Electronics Co., Ltd., Suwon-si, Gyeonggi-do (KR)

(72) Inventor: Seong-seob Shin, Cheonan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 58 days.

(21) Appl. No.: 16/169,289

(22) Filed: Oct. 24, 2018

(65) Prior Publication Data
US 2019/0355436 A1 Nov. 21, 2019

(30) Foreign Application Priority Data
May 17, 2018 (KR) .................. 10-2018-0056770

(51) Int. Cl.
*G11C 29/36* (2006.01)
*G01R 31/3187* (2006.01)
(Continued)

(52) U.S. Cl.
CPC .......... *G11C 29/36* (2013.01); *G01R 31/3187* (2013.01); *G01R 31/31703* (2013.01);
(Continued)

(58) Field of Classification Search
CPC .......... G11C 29/36; G11C 7/18; G11C 29/10; G11C 2029/3602; G11C 2029/4002;
(Continued)

(56) References Cited

U.S. PATENT DOCUMENTS 6,560,740 B1 * 5/2003 Zuraski, Jr. ........ G01R 31/3187
714/727
6,728,916 B2 4/2004 Chen et al.
(Continued)

FOREIGN PATENT DOCUMENTS

| KR | 10-2008-0006711 | 1/2008 |
| KR | 10-2009-0005918 | 1/2009 |
| KR | 10-2013-0070249 | 6/2013 |

OTHER PUBLICATIONS

Wang et al., Built-In Self-Test for Interposer-Based 2.5D ICs, 2014, IEEE, pp. 181-188. (Year: 2014).*
(Continued)

*Primary Examiner* — John J Tabone, Jr.
(74) *Attorney, Agent, or Firm* — Harness, Dickey and Pierce, P.L.C.

(57) ABSTRACT

Provided are a multi-channel package capable of reducing a test cost while performing a test at a high speed, and a test apparatus and a test method of testing the multi-channel package. The multi-channel package includes: a package substrate; and at least two semiconductor chips mounted on the package substrate and having different channels, wherein each of the at least two semiconductor chips includes a built-in-self-test (BIST) circuit and operates in one of a self-test mode, a tester mode, and a target mode during a test, and in the tester mode or the target mode, the at least two semiconductor chips are configured to be inter-channel cross-tested through an external signal path of the package substrate.

16 Claims, 14 Drawing Sheets

(51) Int. Cl.
*G01R 31/317* (2006.01)
*G11C 29/10* (2006.01)
*H01L 25/065* (2006.01)
*G11C 7/18* (2006.01)
*G11C 29/40* (2006.01)

(52) U.S. Cl.
CPC ............... *G11C 7/18* (2013.01); *G11C 29/10* (2013.01); *H01L 25/0657* (2013.01); *G11C 2029/3602* (2013.01); *G11C 2029/4002* (2013.01); *G11C 2207/105* (2013.01)

(58) Field of Classification Search
CPC ........ G11C 2207/105; G01R 31/31703; G01R 31/3187; H01L 25/0657
USPC ................. 714/38, 733, 739, 742, 718, 719; 365/200, 201
See application file for complete search history.

(56) References Cited

U.S. PATENT DOCUMENTS

| | | | |
|---|---|---|---|
| 9,298,573 B2 | 3/2016 | Kobla et al. | |
| 9,406,401 B2 | 8/2016 | Lo et al. | |
| 9,633,748 B2 | 4/2017 | Shibata | |
| 9,728,273 B2* | 8/2017 | Chakraborty | G11C 29/38 |
| 9,837,171 B2 | 12/2017 | Kang | |
| 10,210,948 B2* | 2/2019 | Ok | G11C 29/38 |
| 2001/0047496 A1* | 11/2001 | Hidaka | G11C 29/48 714/5.1 |
| 2002/0070746 A1* | 6/2002 | Sugiura | G01R 31/3187 324/750.3 |
| 2005/0160332 A1* | 7/2005 | Hirabayashi | G11C 29/42 714/718 |
| 2007/0208968 A1 | 9/2007 | Krishnamurthy et al. | |
| 2007/0226568 A1* | 9/2007 | Anzou | G01R 31/31721 714/733 |
| 2010/0195396 A1 | 8/2010 | Higuchi | |
| 2013/0326295 A1 | 12/2013 | Jeon et al. | |
| 2015/0340103 A1* | 11/2015 | Chakraborty | G11C 29/38 714/719 |
| 2016/0161550 A1* | 6/2016 | Yeric | H01L 22/30 324/750.01 |
| 2017/0162276 A1* | 6/2017 | Ok | G11C 29/38 |
| 2019/0180837 A1* | 6/2019 | Ok | G11C 29/38 |
| 2020/0027521 A1* | 1/2020 | Choi | G11C 29/42 |

OTHER PUBLICATIONS

Zhang et al, Face-to-Face Bus Design with Built-in Self-Test in 3D ICs, 2013, IEEE, pp. 1-7. (Year: 2013).*
Zorian et al., Designing Self-Testable Multi-Chip Modules, 1996, IEEE, pp. 181-185. (Year: 1996).*

* cited by examiner

MULTI-CHANNEL PACKAGE, AND TEST APPARATUS AND TEST METHOD OF TESTING THE SAME

CROSS-REFERENCE TO RELATED APPLICATION

This application claims the benefit of Korean Patent Application No. 10-2018-0056770, filed on May 17, 2018, in the Korean Intellectual Property Office, the disclosure of which is incorporated herein in its entirety by reference.

BACKGROUND

Example embodiments of the inventive concepts relate to a test apparatus. For example, at least some example embodiments relate to a multi-channel package that is a test target, and a test apparatus and a test method of testing the multi-channel package.

With the recent trend towards higher speed, higher performance, and higher integration of a semiconductor device, types of the semiconductor device have been diversified, and in response, a test apparatus for testing the semiconductor device has become faster in speed and higher in performance. For example, in a memory semiconductor, a multi-channel is formed and used by arranging a plurality of chips in a package so as to increase a speed. When a product including such a multi-channel is tested, resources of the test apparatus are largely consumed, and thus productivity is decreased. Also, a relatively expensive test apparatus may need to be utilized when a speed of the product increases, leading to an increase in a test cost. In other words, the test cost is gradually increasing due to an increase in speed and capacity of the memory semiconductor.

SUMMARY

Example embodiments of the inventive concepts provide a multi-channel package capable of reducing a test cost while performing a test at a high speed, and a test apparatus and a test method of testing the multi-channel package.

According to an example embodiment of the inventive concepts, there is provided a multi-channel package including a multi-channel package including a package substrate including an external signal path; and at least two semiconductor chips mounted on the package substrate and having different channels, each of the at least two semiconductor chips including a built-in-self-test (BIST) circuit, each of the at least two semiconductor chips configured to perform a test by operating in a selected one of a self-test mode, a tester mode, and a target mode such that, in the tester mode and the target mode, the at least two semiconductor chips are inter-channel cross-testable through the external signal path.

According to another example embodiment of the inventive concepts, there is provided a test apparatus including: a test body configured to generate a test signal to test a multi-channel package, the multi-channel package including at least two semiconductor chips having different channels, each of the at least two semiconductor chips including a built-in-self-test (BIST) circuit, the at least two semiconductor chips configured to operate in a selected one of a self-test mode, a tester mode, and a target mode during a test such that, in the tester mode and the target mode, the at least two semiconductor chips are inter-channel cross-testable; a test board electrically connected to the at least two semiconductor chips of the multi-channel package to allow the test apparatus to perform an inter-channel cross-test; a test head configured to transmit the test signal from the test body to the test board; and a test handler configured to provide the multi-channel package to the test board, and to transfer the multi-channel package to a set location according to a test result.

According to another example embodiment of the inventive concepts, there is provided a test method of testing a multi-channel package, the multi-channel package including at least two semiconductor chips having different channels. In some example embodiments, the method includes applying, by a test apparatus, a mode select signal to the multi-channel package to set a first chip among the at least two semiconductor chips to a tester mode and a second chip among the at least two semiconductor chips to a target mode; applying, by the test apparatus, a test start signal to the first chip; testing, by a built-in-self-test (BIST) circuit of the first chip, the second chip using a test pattern signal such that the test pattern signal is transmitted to the second chip through the test apparatus; and receiving, by the test apparatus, a result of the testing the second chip.

In some example embodiments, the method further includes, based on the result of the testing, selectively completing manufacturing the multi-channel package by instructing a test handler to place the multi-channel package in the output stage.

In some example embodiments, the method further includes, based on the result of the testing, selectively incorporating the multi-channel package into an electronic device.

According to another example embodiment of the inventive concepts, there is provided a test method of testing a multi-channel package, the multi-channel package including at least two semiconductor chips having different channels. In some example embodiments, the test method includes applying, by a test apparatus, a first mode select signal to the multi-channel package to set a first chip among the at least two semiconductor chips to a tester mode and a second chip among the at least two semiconductor chips to a target mode; applying, by the test apparatus, a first test start signal to the first chip; testing, by a first built-in-self-test (BIST) circuit of the first chip, the second chip using a first test pattern signal such that the first test pattern signal is transmitted to the second chip through the test apparatus; receiving, by the test apparatus, a result of testing the second chip; applying, by the test apparatus, a second mode select signal to the multi-channel package to set the second chip to the tester mode and set the first chip to the target mode; applying, by the test apparatus, a second test start signal to the second chip; testing, by a second BIST circuit of the second chip, the first chip using a second test pattern signal such that the second test pattern signal is transmitted to the first chip through the test apparatus; and receiving, by the test apparatus, a result of testing the first chip.

In some example embodiments, the method further includes, based on the result of the testing, selectively completing manufacturing the multi-channel package by instructing a test handler to place the multi-channel package in the output stage.

In some example embodiments, the method further includes, based on the result of the testing, selectively incorporating the multi-channel package into an electronic device.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
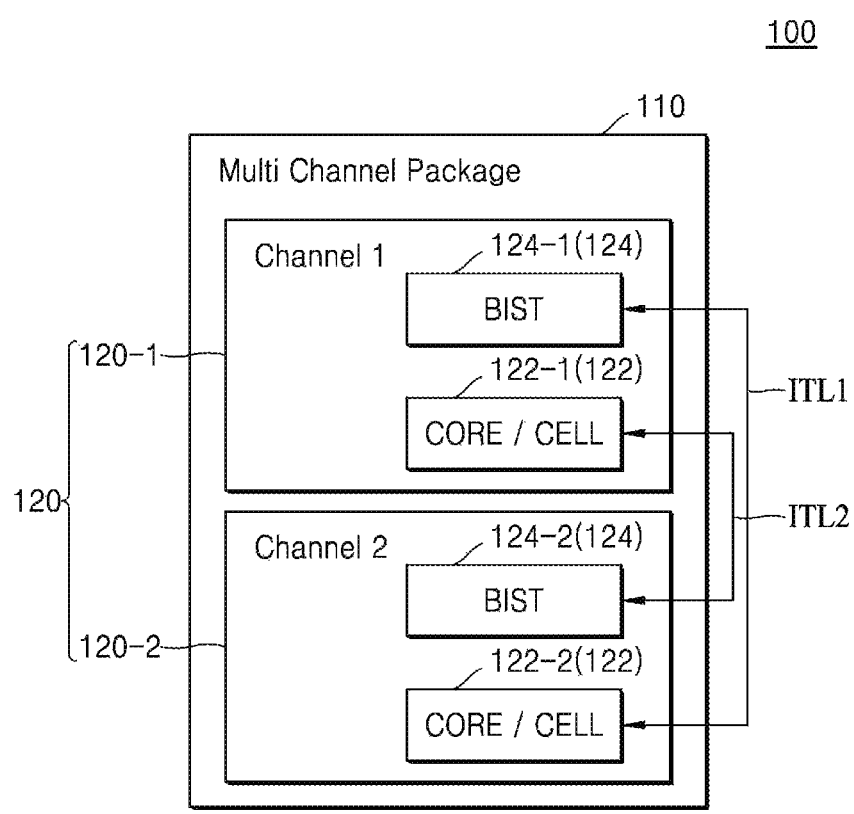
FIGS. 1A and 1B are block diagrams of a multi-channel package according to an example embodiment, and respectively illustrate a principle of an inter-channel cross test and a principle of self-test in each channel.

Hereinafter, one or more embodiments are described in detail with reference to accompanying drawings, where like reference numerals denote like elements, and redundant descriptions are not provided.

Figure 1B:
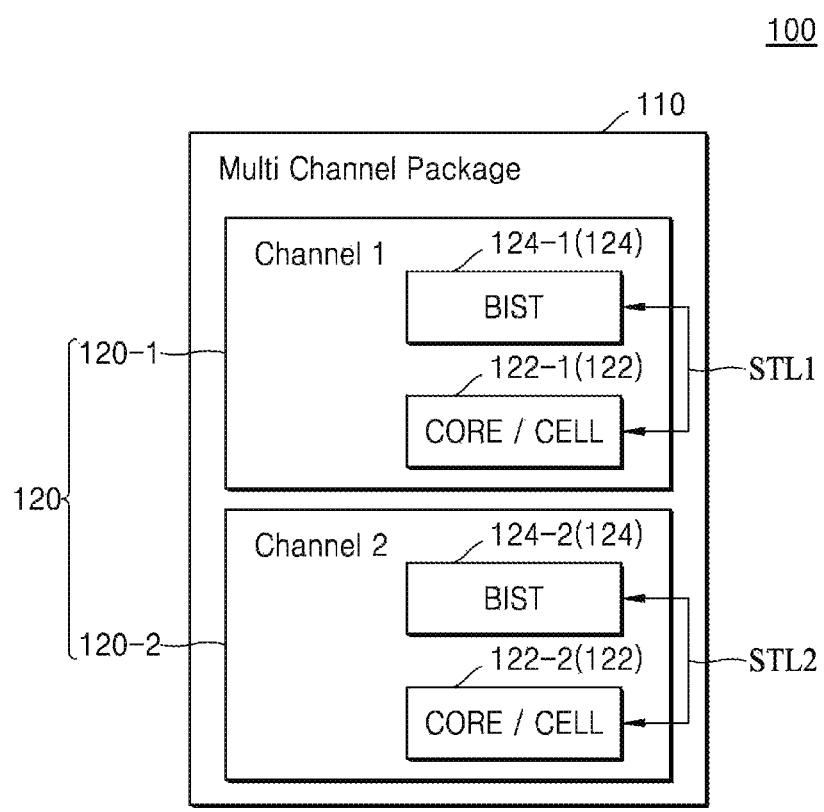

FIGS. 1A and 1B are block diagrams of a multi-channel package 100 according to an example embodiment, and respectively illustrate a principle of an inter-channel cross test and a principle of self-test in each channel.

Referring to FIGS. 1A and 1B, the multi-channel package 100 according to an example embodiment may include a package substrate 110 and a semiconductor chip 120 including at least two channels.

The package substrate 110 may denote a support substrate configuring a frame of the multi-channel package 100. For example, the package substrate 110 may be formed generally based on a ceramic substrate, a printed circuit board (PCB), an organic substrate, or an interposer substrate. In the multi-channel package 100 according to the current embodiment, the package substrate 110 may include, for example, a PCB.

Wires are formed on the package substrate 110, and may have a single layer and/or multilayer structure. The wires may be electrically connected to the semiconductor chip 120, a passive device, or a controller, which are mounted on the package substrate 110. Also, the semiconductor chip 120 may be electrically connected to an external connection member (see an external connection member 115 of FIG. 4A) through the wires.

The package substrate 110 may include the external connection member 115 therebelow. The external connection member 115 may be formed on a pad that is formed on a bottom surface of the package substrate 110, and may mount the multi-channel package 100 on an external system substrate or a main board. The external connection member 115 may be formed of a conductive material. For example, the external connection member 115 may include a solder or include a copper pillar and a solder. However, a material of the external connection member 115 is not limited thereto.

The semiconductor chip 120 may include a memory device 122 and a built-in-self-test (BIST) circuit 124.

A type of chip of the semiconductor chip 120 may be distinguished based on the memory device 122. For example, the semiconductor chip 120 may include the memory device 122, such as a dynamic random access memory (DRAM), a static random access memory (SRAM), a flash memory, a read-only memory (ROM), a programmable read-only memory (PROM), an electrically erasable and programmable read-only memory (EEPROM), a phase-change random access memory (PRAM), a magnetic random access memory (MRAM), a resistance random access memory (RRAM), or a ferroelectric random access memory (FRAM), and accordingly, the semiconductor chip 120 may be a DRAM chip, an SRAM chip, a flash memory chip, a ROM chip, a PROM chip, an EEPROM chip, a PRAM chip, an MRAM chip, an RRAM chip, or a FRAM chip. However, the semiconductor chip 120 may not only include a memory device. For example, the semiconductor chip 120 may include a non-memory device, such as a logic device, for example, a micro-processor, an image signal processor (ISP), a digital signal processor (DSP), or a micro-controller, or a similar device thereof. According to an example embodiment, the multi-channel package 100 includes a memory chip, a passive device, and a controller chip to form a memory module, a memory card, or a memory stick.

In FIGS. 1A and 1B, the memory device 122 is indicated as CORE/CELL, and may include a cell array region where memory cells storing data are arranged in a matrix form, and a core/peri region where circuits writing/reading data around the cell array region are arranged. According to an example embodiment, in the memory device 122, a cell array and a write/read circuit may be collectively referred to as a memory core. Thus, CORE/CELL may be used as a concept in which the above two concepts are combined.

The multi-channel package 100 according to an example embodiment may have a multi-channel structure in which at least two semiconductor chips 120 are mounted on the package substrate 110 and signals are respectively transmitted to the semiconductor chips 120 through at least two channels. As such, when the multi-channel package 100 includes a plurality of the semiconductor chips 120 and has the multi-channel structure, capacity of a memory may increase and a high-speed operation may be realized.

According to a structure of the multi-channel package 100, one channel may be assigned to one semiconductor chip 120, or one channel may be assigned to the plurality of semiconductor chips 120. Also, according to an example embodiment, one chip may include a plurality of memory blocks, and a channel may be assigned per memory block. In FIG. 1A, a first chip 120-1 indicated as Channel 1 and a second chip 120-2 indicated as Channel 2 may physically correspond to one semiconductor chip or a plurality of semiconductor chips. Channel assignment according to the structure of the multi-channel package 100 will be described in detail later with reference to FIGS. 4A through 4D. Hereinafter, it is described that one channel is assigned to one semiconductor chip 120, unless otherwise stated.

The BIST circuit 124 denotes a circuit capable of self-testing the memory device 122 of the semiconductor chip 120. A detailed configuration of the BIST circuit 124 will be described below with reference to FIG. 3.

As described above, a speed and capacity are increasing as a multi-channel package includes a plurality of semiconductor chips and is configured in a multi-channel. However, an expensive test apparatus may be required to test the multi-channel package, and thus a test cost is increased. In order to reduce such cost, channel branching technology and/or a design for test (DFT) technology may be used, but there is a limit to testing the multi-channel package at a high speed using the channel branching technology and/or DFT technology. For example, the channel branching technology, in which semiconductor chips are directly tested by branching a signal of a test apparatus according to channels, has a slow speed, and thus a high-speed test is not possible. Also, when a BIST circuit using the DFT technology is used, a semiconductor chip may be self-tested at a high speed, but performance deterioration or defect of the package substrate 110 outside the semiconductor chip may be unable to be tested.

Figure 7:
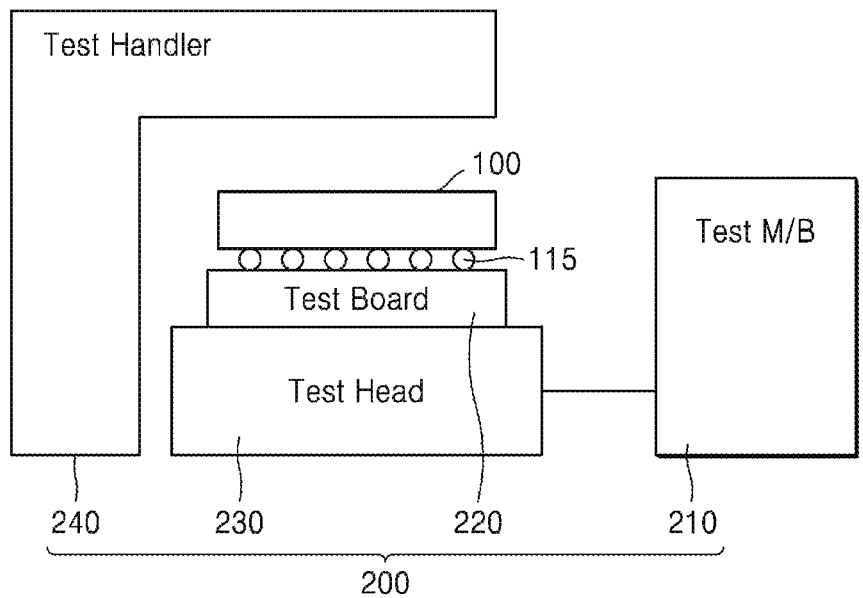
FIG. 7 is a block diagram of a test apparatus for testing a multi-channel package, according to an example embodiment.

The multi-channel package 100 according to an example embodiment may be configured to test the memory device 122 of another semiconductor chip 120 through a test apparatus 200 of FIG. 7 using the BIST circuit 124. In other words, the multi-channel package 100 according to an example embodiment may be configured such that the at least two semiconductor chips 120 are inter-channel cross-tested by using the BIST circuit 124 and the test apparatus 200 outside the multi-channel package 100.

Further referring to FIG. 1A, the multi-channel package 100 according to an example embodiment may include the first chip 120-1 and the second chip 120-2 on the package substrate 110. Also, the first chip 120-1 may include a first memory device 122-1 and a first BIST circuit 124-1, and the second chip 120-2 may include a second memory device 122-2 and a second BIST circuit 124-2. A first channel Channel 1 may be assigned to the first chip 120-1 and a second channel Channel 2 may be assigned to the second chip 120-2. In such a structure of the multi-channel package 100, the first BIST circuit 124-1 may test the second memory device 122-2 of the second chip 120-2 through a first cross-test line ITL1, and the second BIST circuit 124-2 may test the first memory device 122-1 of the first chip 120-1 through a second cross-test line ITL2. Here, the first cross-test line ITL1 and the second cross-test line ITL2 may include a path of the multi-channel package 100 and the test apparatus 200 outside the multi-channel package 100.

As such, the multi-channel package 100 according to an example embodiment may solve issues of testing an existing multi-channel package by using the BIST circuit 124 and arranging the first chip 120-1 and the second chip 120-2 on the package substrate 110 such that an inter-channel cross test is performed via the test apparatus 200. In other words, since the test apparatus 200 does not directly test the semiconductor chip 120 but through the BIST circuit 124, speed may be prevented from decreasing due to channel branching. Accordingly, an expensive test apparatus for testing the high-speed multi-channel package 100 at a high speed may not be required. For example, even the test apparatus 200 that is inexpensive and has an operation speed that is slower than that of the semiconductor chip 120 of the multi-channel package 100 may perform a test at a high speed in response to the operation speed of the semiconductor chip 120. Also, since the BIST circuit 124 that tests the semiconductor chip 120, is associated with another semiconductor chip other than the semiconductor chip 120 to which the BIST circuit 124 is included, through the test apparatus 200, a defect or performance deterioration on an external path to the semiconductor chip 120 that is a test target may be tested in addition to the semiconductor chip 120.

Meanwhile, in the multi-channel package 100 according to an example embodiment, the BIST circuit 124 may test the memory device 122 in the semiconductor chip 120 to which the BIST circuit 124 is included, as shown in FIG. 1B. For example, the first BIST circuit 124-1 of the first chip 120-1 may test the first memory device 122-1 through a first self-test line STL1, and the second BIST circuit 124-2 of the second chip 120-2 may test the second memory device 122-2 through a second self-test line STL2. Here, the first self-test line STL1 may only include a path in the first chip 120-1 and the second self-test line STL2 may only include a path in the second chip 120-2. Whether the BIST circuit 124 tests the memory device 122 of the semiconductor chip 120 to which the BIST circuit 124 is included or tests the memory device 122 of the other semiconductor chip 120 may be determined based on mode selection in a mode register set (MRS) in the BIST circuit 124. The mode selection will be described in detail below with reference to FIG. 5.

Figure 2A:
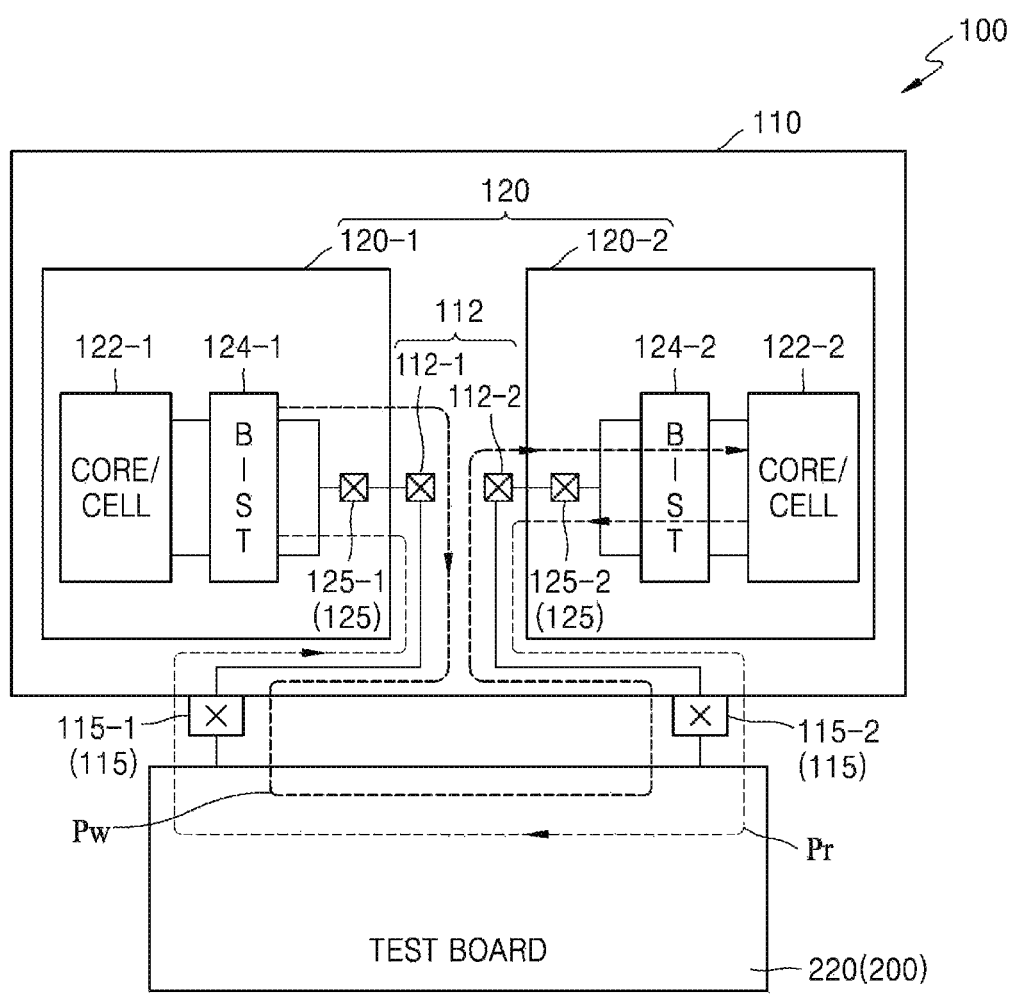
FIGS. 2A and 2B are block diagrams illustrating a path in which a first built-in-self-test (BIST) circuit of a first chip tests a second chip, in the multi-channel package of FIG. 1A in detail.
Figure 2B:
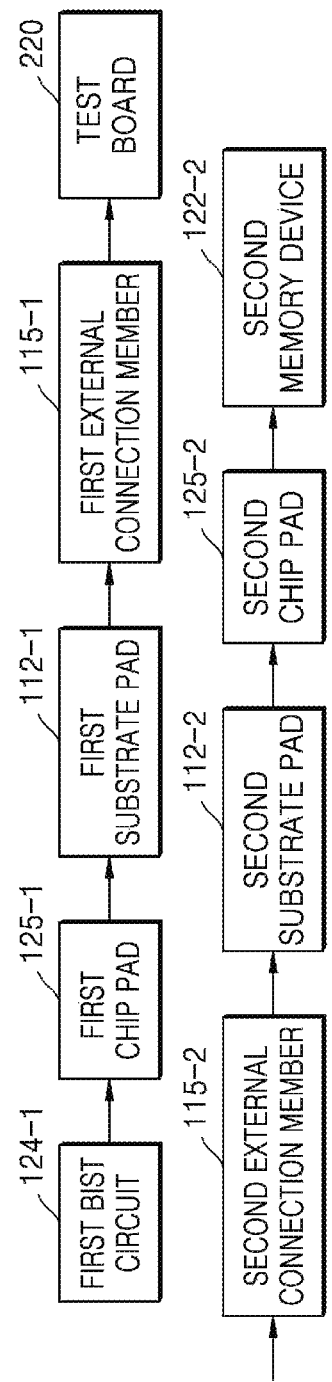

FIGS. 2A and 2B are block diagrams illustrating a path in which the first BIST circuit 124-1 of the first chip 120-1 tests the second chip 120-2, in the multi-channel package 100 of FIG. 1A in detail.

Referring to FIGS. 2A and 2B, the first BIST circuit 124-1 of the first chip 120-1 may transmit a test pattern signal to the second memory device 122-2 of the second chip 120-2 through a path Pw indicated in thick dashed lines. In detail, as shown in FIG. 2B, the test pattern signal may be transmitted from the first BIST circuit 124-1 sequentially to a first chip pad 125-1 of the first chip 120-1, a first substrate pad 112-1 of the package substrate 110, a first external connection member 115-1 of the package substrate 110, a test board 220 of the test apparatus 200, a second external connection member 115-2 of the package substrate 110, a second substrate pad 112-2 of the package substrate 110, a second chip pad 125-2 of the second chip 120-2, and the second memory device 122-2 of the second chip 120-2. Such transmission of the test pattern signal from the first BIST circuit 124-1 to the second memory device 122-2 may correspond to a type of data writing or storing.

Meanwhile, data stored in the second memory device 122-2 of the second chip 120-2 through transmission of the test pattern signal may be read by the first BIST circuit 124-1 as a data signal through a path Pr indicated in thin dashed lines. In detail, the data stored in the second memory device 122-2 may be transmitted, as the data signal, from the second memory device 122-2 sequentially to the second chip pad 125-2 of the second chip 120-2, the second substrate pad 112-2 of the package substrate 110, the second external connection member 115-2 of the package substrate 110, the test board 220 of the test apparatus 200, the first external connection member 115-1 of the package substrate 110, the first substrate pad 112-1 of the package substrate 110, the first chip pad 125-1 of the first chip 120-1, and the first BIST circuit 124-1 of the first chip 120-1. Such transmission of the test pattern signal from the second memory device 122-2 to the first BIST circuit 124-1 may correspond to a type of data reading.

The first BIST circuit 124-1 may compare the data signal read from the second memory device 122-2 with the test pattern signal to determine whether the second memory device 122-2, i.e., the second chip 120-2 is normal or defective. Also, the first BIST circuit 124-1 may determine performance deterioration or defects of not only the second chip 120-2, but also a component outside the semiconductor chip 120 on a path through which the test pattern signal and/or the data signal is transmitted. In other words, the first BIST circuit 124-1 may test performance deterioration or defect on a path from the first chip pad 125-1 of the first chip 120-1 to the second chip pad 125-2 of the second chip 120-2.

In addition, the first memory device 122-1 of the first chip 120-1 may be tested through the second BIST circuit 124-2 of the second chip 120-2, along a similar path as the testing of the second memory device 122-2 through the first BIST circuit 124-1. According to an example embodiment, the first memory device 122-1 of the first chip 120-1 may be self-tested by the first BIST circuit 124-1.

Figure 3:
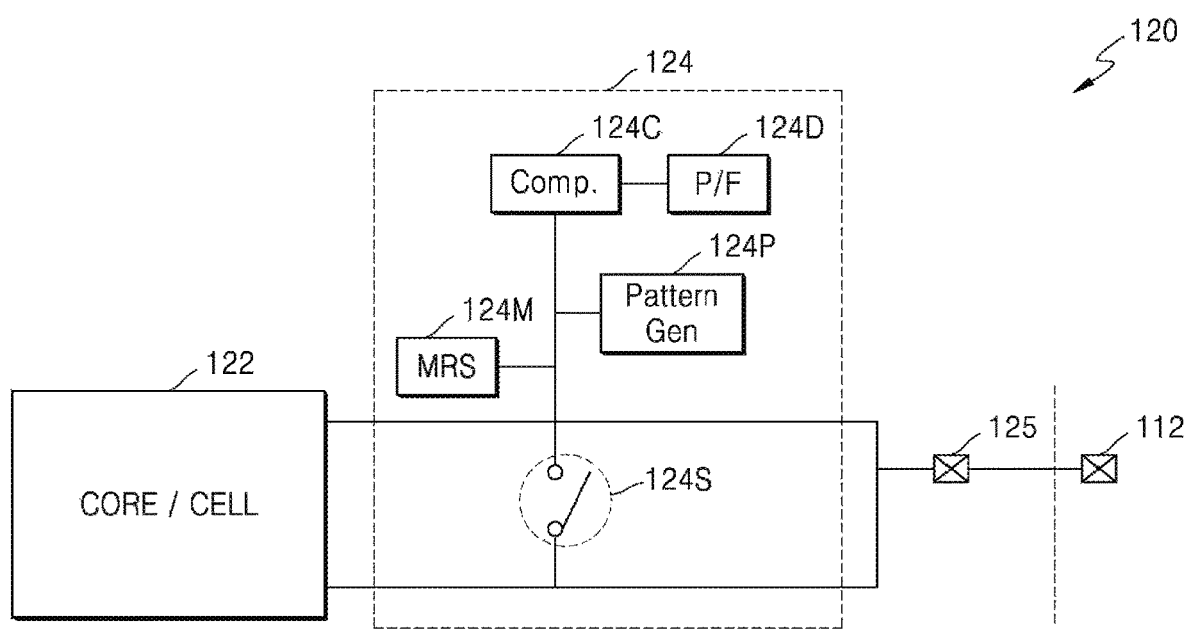
FIG. 3 is a block diagram illustrating a BIST circuit in the multi-channel package of FIG. 1A in detail.

FIG. 3 is a block diagram illustrating the BIST circuit 124 in the multi-channel package 100 of FIG. 1A in detail.

Referring to FIG. 3, the BIST circuit 124 may include a mode register set (MRS) 124M, a pattern generator 124P, a comparator 124C, a determiner 124D, and a switching device 124S.

For example, the BIST circuit 124 may include a memory and processing circuitry, the memory may store computer readable instructions that, when executed by the processing circuitry, configure the processing circuitry to perform the functions of one or more of the MRS 124M, the pattern generator 124P, the comparator 124C, the determiner 124D, and the switching device 124S.

The MRS 124M may store a mode of the BIST circuit 124. For example, the MRS 124M may store one of a self-test mode, a tester mode, and a target mode. The self-test mode is a mode in which the BIST circuit 124 tests the memory device 122 of the semiconductor chip 120 to which the BIST circuit 124 itself is included, the tester mode is a mode in which the BIST circuit 124 tests the memory device 122 of another semiconductor chip 120, and the target mode is a mode in which the memory device 122 of the semiconductor chip 120, which is a test target, is tested by the BIST circuit 124 of another semiconductor chip 120. A mode that may be stored in the MRS 124M when there are two semiconductor chips 120 will be described in detail below with reference to FIG. 5. Meanwhile, the mode stored in the MRS 124M of the BIST circuit 124 of the semiconductor chip 120 may be determined by a mode select signal applied from the test apparatus 200 of FIG. 7.

The pattern generator 124P may generate a test pattern signal for testing the semiconductor chip 120. For example, the pattern generator 124P may generate a test pattern signal that is an optimum logic signal for easily and accurately testing the memory device 122 of the semiconductor chip 120, i.e., a test target, based on DFT technology.

The comparator 124C compares a data signal read from data stored in the memory device 122 of the semiconductor chip 120, i.e., a test target, with a test pattern signal temporarily stored in a buffer or received from the pattern generator 124P.

The determiner 124D determines whether the memory device 122, i.e., the semiconductor chip 120, is normal (pass) or defective (fail) according to a result of the comparing of the comparator 124C, and stores a result of the determining.

Meanwhile, the switching device 124S may be turned on or off according to a mode of the MRS 124M. For example, when the MRS 124M is in the self-test mode, the switching device 124S may be turned off so that the BIST circuit 124 self-tests the memory device 122 of the semiconductor chip 120 to which the BIST circuit 124 itself is included, and when the MRS 124M is in the tester mode, the switching device 124S may be turned on so that the BIST circuit 124 tests the memory device 122 of the other semiconductor chip 120.

In the multi-channel package 100 of an example embodiment, only the switching device 124S is shown in the BIST circuit 124, but a configuration of the BIST circuit 124 is not limited thereto. For example, the BIST circuit 124 may include various circuits for transmitting a test pattern signal to the memory device 122 of the semiconductor chip 120, i.e., a test target, and reading a data signal from the memory device 122, for example, may include circuits such as a multiplexer (MUX), a demultiplexer (DeMUX), a diode, and a buffer. Also, the semiconductor chip 120 may include various circuits for writing data on the memory device 122 through a chip pad 125 or reading data from the memory device 122. Meanwhile, the chip pad 125 of the semiconductor chip 120 may be electrically connected to a substrate pad 112 of the package substrate 110.

FIGS. 4A through 4D are cross-sectional views of multi-channel packages 100a through 100d according to example embodiments.

Figure 4A:
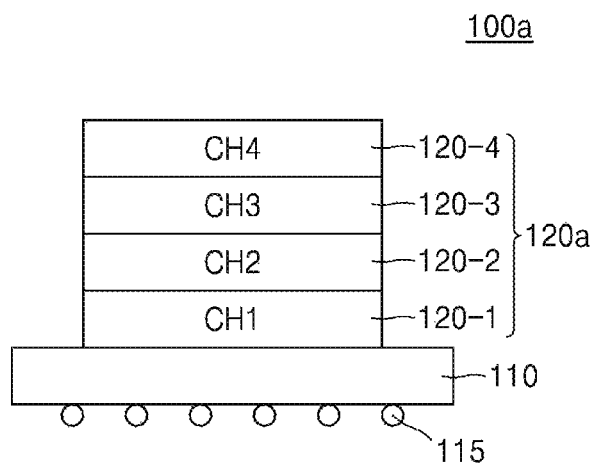
FIGS. 4A through 4D are cross-sectional views of multi-channel packages according to embodiments.

Referring to FIG. 4A, the multi-channel package 100a of an example embodiment may include four semiconductor chips 120a on the package substrate 110. Also, each of the four semiconductor chips 120a may have one corresponding channel. For example, the first chip 120-1 may have a first channel CH1, the second chip 120-2 may have a second channel CH2, a third chip 120-3 may have a third channel CH3, and a fourth chip 120-4 may have a fourth channel CH4.

As shown in FIG. 4A, the four semiconductor chips 120a may be arranged on the package substrate 110 in a stacked structure. The chip pad 125 of FIG. 2A of each of the four semiconductor chips 120a may be connected to the substrate pad 112 of FIG. 2A of the package substrate 110 via a wire or a through electrode.

For reference, when the chip pad 125 is connected via the wire, active surfaces of the four semiconductor chips 120a may be arranged to face upward, and the chip pad 125 may be arranged on the active surfaces. Also, the four semiconductor chips 120a may be stacked in a zigzag or stepped structure such that the chip pad 125 is exposed. Meanwhile, when the chip pad 125 is connected via the through electrode, the active surfaces of the four semiconductor chips 120a may be arranged to face downward. Also, four semiconductor chips 120a may be stacked such that side surfaces are aligned.

Although not illustrated, the top surface of the package substrate 110 and the four semiconductor chips 120a may be sealed by a sealant. According to an example embodiment, the top surface of the fourth chip 120-4 may be covered by the sealant or exposed from the sealant.

The external connection member 115 may be disposed on the bottom surface of the package substrate 110. For example, the external connection member 115 may include a solder or include a copper pillar and a solder. The external connection member 115 may be electrically connected to the substrate pad 112 through wires of the package substrate 110. Accordingly, the four semiconductor chips 120a may be electrically connected to the external connection member 115 through the substrate pad 112 and the wires of the package substrate 110.

In the multi-channel package 100a according to an example embodiment, each of the four semiconductor chips 120a includes the BIST circuit 124 of FIG. 2A, and the package substrate 110 and the four semiconductor chips 120a may be configured such that an inter-channel cross test is possible. The inter-channel cross test of the four semiconductor chips 120a may be performed via any one of various methods, and details thereof will be described below with reference to FIGS. 6A through 6D.

In the multi-channel package 100a according to an example embodiment, the four semiconductor chips 120a are stacked on the package substrate 110, but the number of stacked semiconductor chips 120a is not limited to four. For example, two, three, five, or more semiconductor chips 120a may be stacked on the package substrate 110.

Figure 4B:
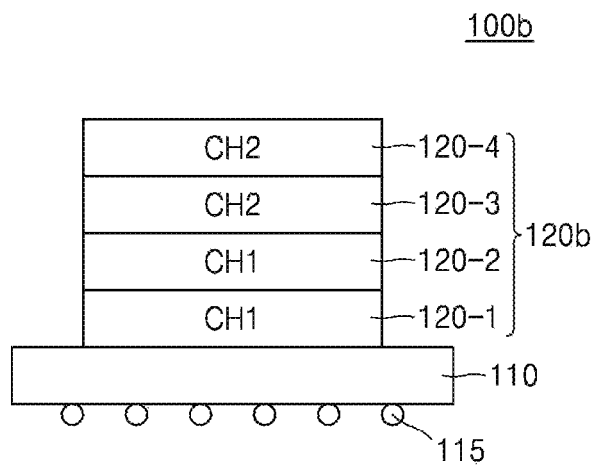

Referring to FIG. 4B, the multi-channel package 100b according to an example embodiment may be similar to the multi-channel package 100a of FIG. 4A in that the multi-channel package 100b includes four semiconductor chips 120b on the package substrate 110. However, the multi-channel package 100b according to an example embodiment may be different from the multi-channel package 100a of FIG. 4A in a configuration of channels. In detail, in the multi-channel package 100a of FIG. 4A, the four semiconductor chips 120a may each have one channel. On the other hand, in the multi-channel package 100b according to an example embodiment, two semiconductor chips 120b may share one channel. For example, the first and second chips 120-1 and 120-2 may share the first channel CH1, and the third and fourth chips 120-3 and 120-4 may share the second channel CH2. In other words, the two semiconductor chips 120b sharing one channel correspond to two chips physically, but may correspond to one chip in terms of channels.

In the multi-channel package 100b according to an example embodiment as well, the number of semiconductor chips 120b other than four may be stacked on the package substrate 110. However, since two semiconductor chips 120b share one channel, the even number of semiconductor chips 120b may be stacked on the package substrate 110.

In addition, a stacked structure of the four semiconductor chips 120b, a sealant, the external connection member 115, etc. are the same as those described above with respect to the multi-channel package 100a of FIG. 4A.

Figure 4C:
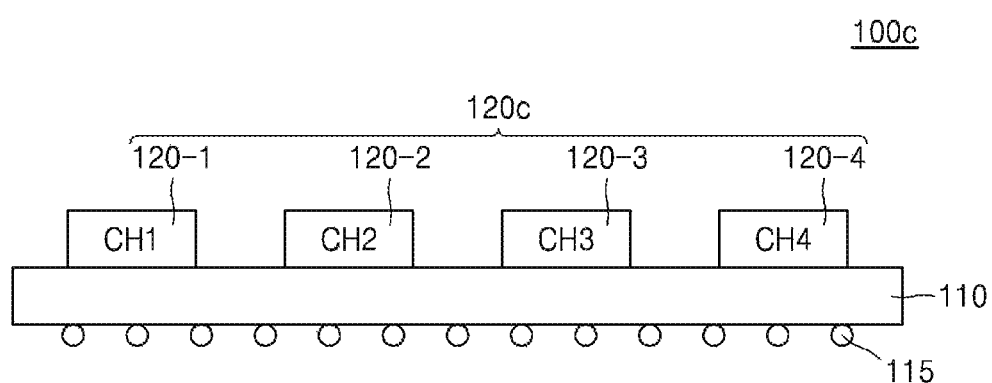

Referring to FIG. 4C, the multi-channel package 100c according to an example embodiment may be different from the multi-channel package 100a of FIG. 4A in an arrangement of four semiconductor chips 120c on the package substrate 110. In detail, in the multi-channel package 100c according to an example embodiment, the four semiconductor chips 120c may be spaced apart from each other on the package substrate 110, in a horizontal direction. Also, as illustrated, each of the four semiconductor chips 120c may have one channel.

The chip pad 125 of FIG. 2A of the four semiconductor chips 120c may be connected to the substrate pad 112 of FIG. 2A of the package substrate 110 via a wire or a bump. When the chip pad 125 is connected via the wire, active surfaces of the four semiconductor chips 120c may face upward. Also, when the chip pad 125 is connected via the bump, the active surfaces of the four semiconductor chips 120c may face downward.

In the multi-channel package 100c according to an example embodiment, the four semiconductor chips 120c each include one channel, but a channel configuration is not limited thereto. For example, like the multi-channel package 100b of FIG. 4B, the two semiconductor chips 120c may share one channel. Also, the four semiconductor chips 120c are arranged on the package substrate 110, but the number of semiconductor chips 120c is not limited to four. For example, two, three, five, or more semiconductor chips 120c may be spaced apart from each other on the package substrate 110, in the horizontal direction.

In addition, a sealant, the external connection member 115, etc. are the same as those described above with respect to the multi-channel package 100a of FIG. 4A.

Figure 4D:
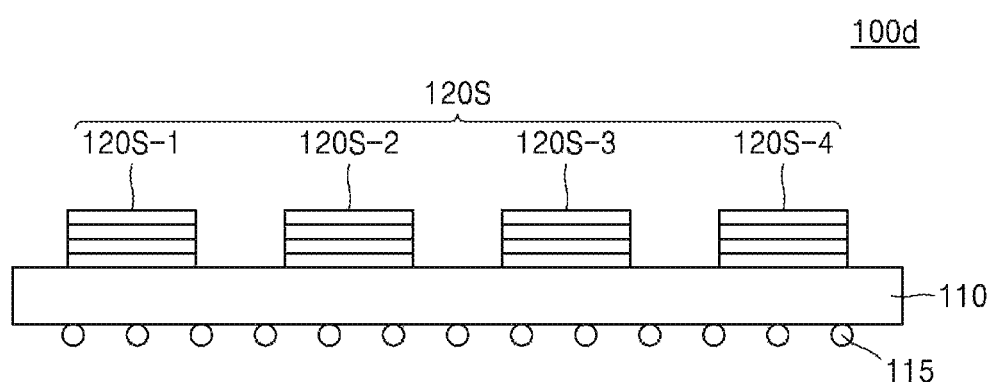

Referring to FIG. 4D, the multi-channel package 100d according to an example embodiment may correspond to a structure in which the multi-channel package 100a of FIG. 4A and the multi-channel package 100c of FIG. 4C are combined. In detail, the multi-channel package 100d according to an example embodiment may include four stacked structures 120S arranged on the package substrate 110. For example, the four stacked structures 120S may include first through fourth stacked structures 120S-1 through 120S-4 each including a plurality of semiconductor chips. In other words, each of the four stacked structures 120S may correspond to a structure of the multi-channel package 100a of FIG. 4A, in which the four semiconductor chips 120a are stacked. Also, the four stacked structures 120S may be spaced apart from each other on the package substrate 110, in the horizontal direction. Accordingly, each of the four stacked structures 120S may correspond to the four semiconductor chips 120c in the multi-channel package 100c of FIG. 4C.

In the multi-channel package 100d according to an example embodiment, each of the four stacked structures 120S may include the same number, for example, four semiconductor chips. However, in the multi-channel package 100d according to an example embodiment, the structure of the stacked structure 120S is not limited thereto. For example, each of the four stacked structure 120S may include the number of semiconductor chips other than four. Also, the four stacked structures 120S may include the same number of semiconductor chips or different numbers of semiconductor chips. For example, at least one stacked structure 120S may include the number of semiconductor chips different from the other stacked structure 120S.

Also, in the multi-channel package 100d according to an example embodiment, the four stacked structures 120S are arranged on the package substrate 110, but the number of stacked structures 120S is not limited to four. For example, two, three, five, or more stacked structures 120S may be spaced apart from each other on the package substrate 110, in the horizontal direction.

Meanwhile, in the multi-channel package 100d according to an example embodiment, each of the four stacked structures 120S may have one channel. Accordingly, four semiconductor chips forming each of the four stacked structures 120S may share one channel. As a result, the multi-channel package 100d according to an example embodiment may have four channels. However, a channel configuration is not limited thereto. For example, as in the multi-channel package 100a of FIG. 4A, one semiconductor chip may have one channel, or as in the multi-channel package 100b of FIG. 4B, two semiconductor chips may share one channel. In this case, the multi-channel package 100d may have 16 channels or 8 channels.

In addition, each stacked structure of the four stacked structures 120S, a sealant, the external connection member 115, etc. are the same as those described above with respect to the multi-channel package 100a of FIG. 4A.

Figure 5:
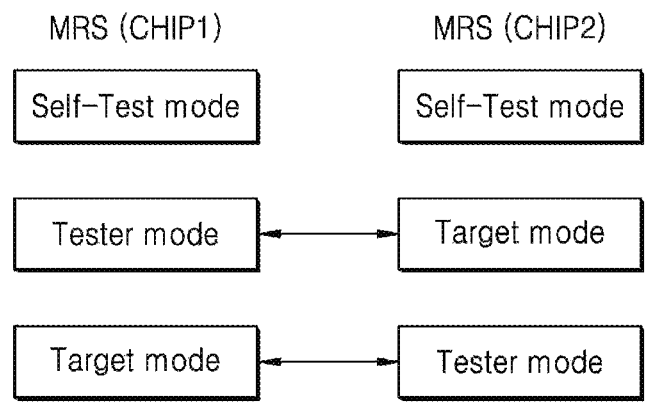
FIG. 5 is a conceptual diagram illustrating modes selected when two chips are each self-tested and when two chips are cross-tested, in a multi-channel package according to an example embodiment.

FIG. 5 is a conceptual diagram illustrating modes selected when two chips are each self-tested and when two chips are cross-tested, in a multi-channel package according to an example embodiment.

Referring to FIG. 5, first, when two chips are each self-tested, a self-test mode may be selected and stored in an MRS of a first chip CHIP1, and a self-test mode may be selected and stored in an MRS of a second chip CHIP2. The selecting and storing of the self-test mode may be performed according to a mode select signal applied from the test apparatus 200 of FIG. 7. When a test start signal is applied from the test apparatus 200 after the self-test mode is selected and stored in the MRS of each of the two semiconductor chips 120 of FIG. 1B, the BIST circuit 124 of FIG. 1B may self-test the memory device 122 of FIG. 1B of the semiconductor chip 120 to which the BIST circuit 124 itself is included.

Then, when the two semiconductor chips 120 are cross-tested, a tester mode may be selected and stored in the MRS of the first chip CHIP1 and a target mode may be selected and stored in the MRS of the second chip CHIP2. The selecting and storing of the tester mode and the target mode may also be performed according to a mode select signal applied from the test apparatus 200. Then, when a test start signal is applied from the test apparatus 200, the first BIST circuit 124-1 of the first chip 120-1 of FIG. 1A may test the second memory device 122-2 of the second chip 120-2 of FIG. 1A via the test board 220 of FIG. 7 of the test apparatus 200.

On the other hand, when the two semiconductor chips 120 are cross-tested, a target mode may be selected and stored in the MRS of the first chip CHIP1 and a target mode may be selected and stored in the MRS of the second chip CHIP2. Then, when a test start signal is applied from the test apparatus 200, the second BIST circuit 124-2 of the second chip 120-2 may test the first memory device 122-1 of the first chip 120-1 via the test board 220.

FIGS. 6A through 6D are conceptual diagrams for describing various methods by which multi-channel packages 100M1 through 100M4 perform an inter-channel cross test, according to embodiments.

Figure 6A:
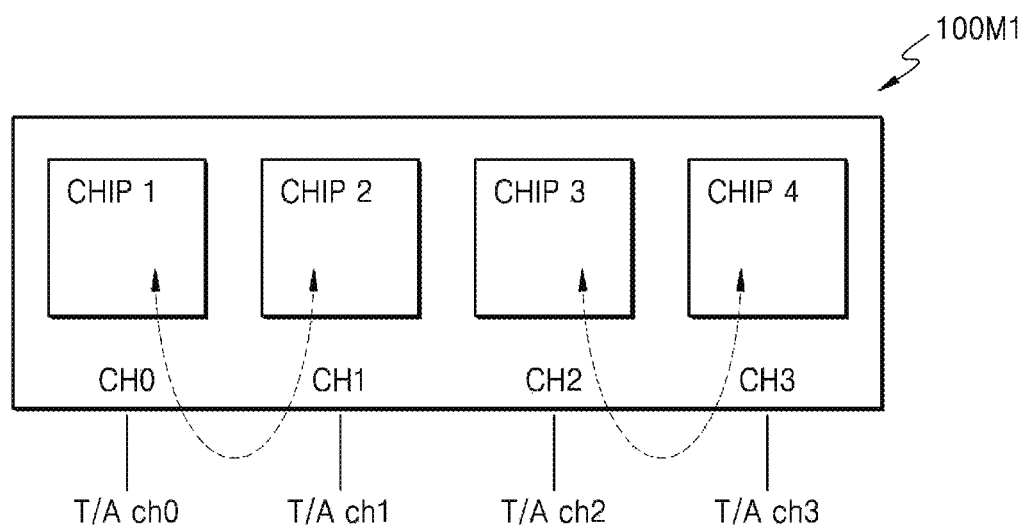
FIGS. 6A through 6D are conceptual diagrams for describing various methods by which multi-channel packages perform an inter-channel cross test, according to embodiments.

Referring to FIG. 6A, in the multi-channel package 100M1 according to an example embodiment, four semiconductor chips, i.e., first through fourth chips CHIP1 through CHIP4, may be inter-channel cross-tested by two channels. In detail, a BIST circuit of the first chip CHIP1 may test a memory device of the second chip CHIP2, and a BIST circuit of the second chip CHIP2 may test a memory device of the first chip CHIP1. Also, a BIST circuit of the third chip CHIP3 may test a memory device of the fourth chip CHIP4, and a BIST circuit of the fourth chip CHIP4 may test a memory device of the third chip CHIP3.

An inter-channel cross test may be performed via the test board 220 of the test apparatus 200 of FIG. 7. Also, signal transmission between the test apparatus 200 and the first through fourth chips CHIP1 through CHIP4 may be performed through each channel of the test apparatus 200 corresponding to a channel of each of the first through fourth chips CHIP1 through CHIP4. For reference, in FIGS. 6A through 6D, T/A denotes the test apparatus 200. For example, the first through fourth chips CHIP1 through CHIP4 may transmit or receive a signal to or from the test apparatus 200 through first through fourth channels CH0 through CH3 and through corresponding first through fourth channels T/A ch0 through T/A ch3 of the test apparatus 200. Meanwhile, a signal transmitted from the test apparatus 200 to the first through fourth chips CHIP1 through CHIP4 may be, for example, a mode select signal or a test start signal, and a signal transmitted from the first through fourth chips CHIP1 through CHIP4 to the test apparatus 200 may be a signal regarding a test result.

Figure 6B:
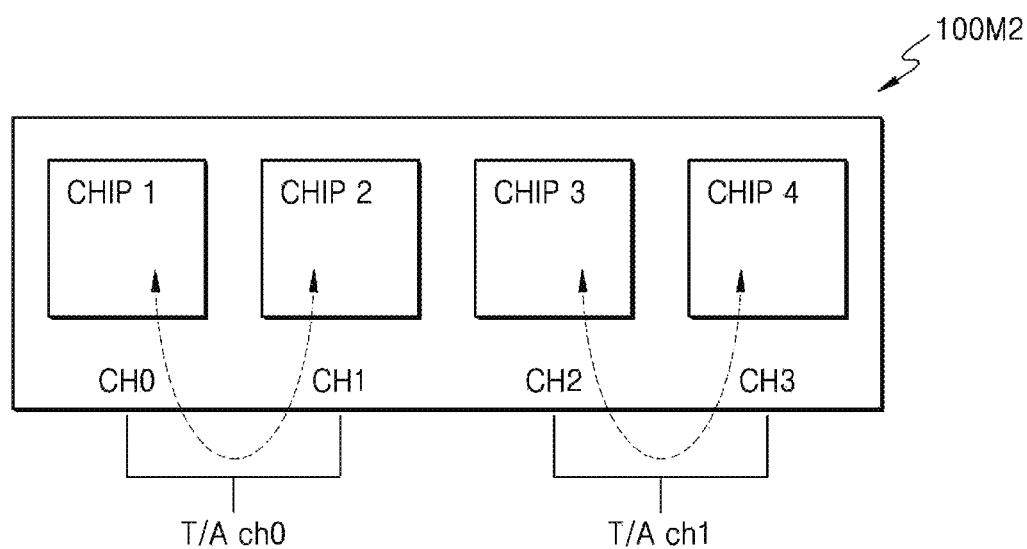

Referring to FIG. 6B, an inter-channel cross test of the multi-channel package 100M2 according to an example embodiment may be similar to that of the multi-channel package 100M1 of FIG. 6A, in that the first through fourth chips CHIP1 through CHIP4 are inter-channel cross-tested by two channels. However, in the multi-channel package 100M2 according to an example embodiment, signal transmission between the test apparatus 200 and the first through fourth chips CHIP1 through CHIP4 may be performed via channel branching technology. For example, a signal may be transmitted to the first and second channels CH0 and CH1 of the first and second chips CHIP1 and CHIP2 through the first channel T/A ch0 of the test apparatus 200, and a signal may be transmitted to the third and fourth channels CH2 and CH3 of the third and fourth chips CHIP3 and CHIP4 through the second channel T/A ch1 of the test apparatus 200.

As described above, when channel branching technology is applied to an existing multi-channel package, a test speed may be decreased. Such a decrease in the test speed occurs when the test apparatus 200 directly tests a semiconductor chip through a channel, and is not relevant to a self-test or a cross test through a BIST circuit. In other words, the test speed may be decreased when channel branching technology is applied to a case where the test apparatus 200 directly applies a test pattern signal to a semiconductor chip and performs a test by reading a stored data signal. On the other hand, when the test apparatus 200 applies a minimum signal, such as a mode select signal or a test start signal, to the multi-channel package 100M2 and a BIST circuit performs a test as in the multi-channel package 100M2 according to an example embodiment, a test speed is not decreased even when channel branching technology is applied. As such, the multi-channel package 100M2 according to an example embodiment enables semiconductor chips to be tested at a high speed by using an inexpensive and low-speed test apparatus while applying channel branching technology.

Figure 6C:
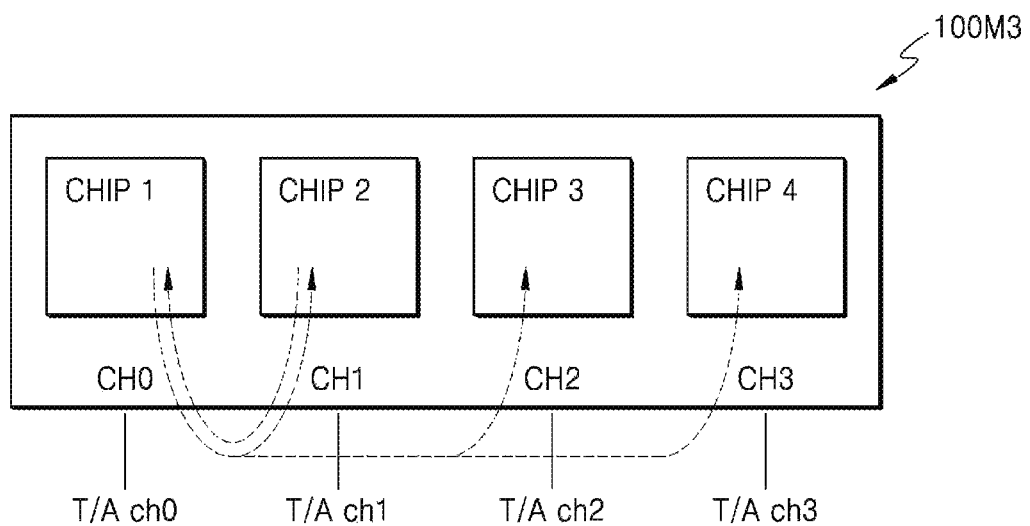

Referring to FIG. 6C, in the multi-channel package 100M3 according to an example embodiment, a BIST circuit of one of the first through fourth chips CHIP1 through CHIP4, for example, the first chip CHIP1, may test a memory device of the second through fourth chips CHIP2 through CHIP4. Also, a BIST circuit of one of the second through fourth chips CHIP2 through CHIP4, for example, the second chip CHIP2, may test a memory device of the first chip CHIP1.

An inter-channel cross test in the multi-channel package 100M3 according to an example embodiment may also be performed via the test board 220 of the test apparatus 200. Accordingly, a defect or performance deterioration on an external path of the first through fourth chips CHIP1 through CHIP4 may be tested. Also, a memory device of each of the first through fourth chips CHIP1 through CHIP4 may also be tested.

Figure 6D:
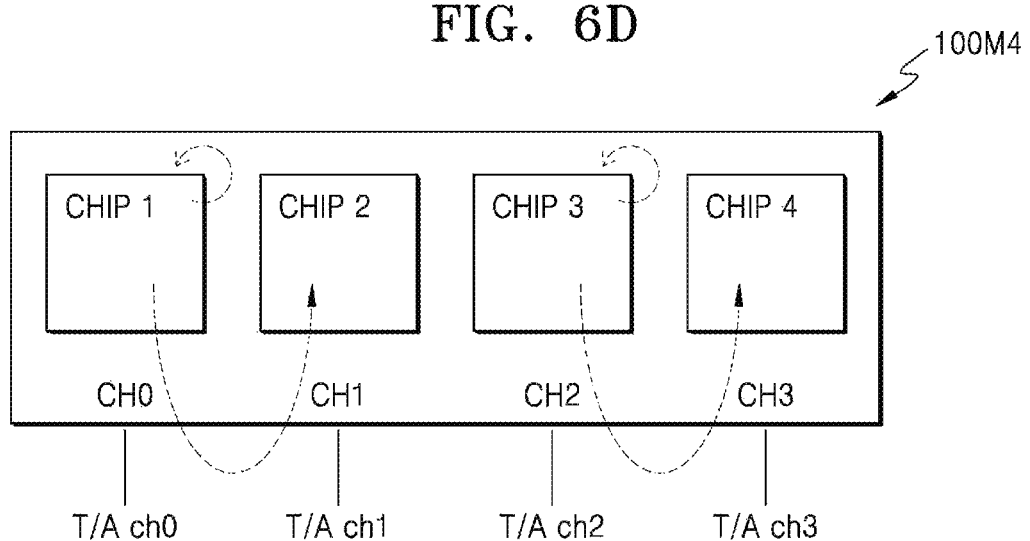

Referring to FIG. 6D, in the multi-channel package 100M4 according to an example embodiment, a BIST circuit of the first chip CHIP1 may test a memory device of the second chip CHIP2, and a BIST circuit of the third chip CHIP3 may test a memory device of the fourth chip CHIP4. Also, the first chip CHIP1 may be self-tested by its own BIST circuit and the third chip CHIP3 may also be self-tested by its own BIST circuit.

In an inter-channel cross test in the multi-channel package 100M4 according to an example embodiment, the testing of the memory device of the second chip CHIP2 by the BIST circuit of the first chip CHIP1 and the testing of the memory device of the fourth chip CHIP4 by the BIST circuit of the third chip CHIP3 may be performed via the test board 220 of the test apparatus 200. Accordingly, a defect or performance deterioration on an external path of the first through fourth chips CHIP1 through CHIP4 may be tested. Also, a memory device of each of the first through fourth chips CHIP1 through CHIP4 may also be tested.

For reference, the inter-channel cross test in the multi-channel package 100M4 according to an example embodiment may not technically correspond to an inter-channel cross test since a test in one direction and a self-test are combined. However, in a wide concept, when the inter-channel cross test is defined as a method of testing memory devices of all semiconductor chips of a multi-channel package while testing a memory device of at least one other semiconductor chip through the test apparatus 200 by using a BIST circuit of at least one semiconductor chip, a test method of the multi-channel package 100M4 according to an example embodiment may also be included in the inter-channel cross test.

Also, although not described in the example embodiments of FIGS. 6A through 6D, other example embodiments belonging to the inter-channel cross test of the wide concept may also belong to the technical ideas of the inventive concepts.

FIG. 7 is a block diagram of the test apparatus 200 for testing the multi-channel package 100, according to an example embodiment. Details that have been described with reference to FIGS. 1A through 6D will be briefly described or omitted.

Referring to FIG. 7, the test apparatus 200 according to an example embodiment may include a test main body 210, the test board 220, a test head 230, and a test handler 240.

The test apparatus 200 is an apparatus for testing the multi-channel package 100, and may be referred to as auto test equipment (ATE) in a functional aspect, according to an example embodiment. The multi-channel package 100 is a test target of the test apparatus 200, and may be the multi-channel package 100 of FIG. 1A. However, alternatively, any one of the multi-channel packages 100a through 100d of FIGS. 4A through 4D may be a test target and tested by the test apparatus 200 according to an example embodiment.

The test main body 210 may generate a test signal for testing the multi-channel package 100, and transmit the test signal to the test head 230. The test signal may include a test pattern signal for substantially testing the multi-channel package 100. Also, the test signal may include a mode select signal, a test start signal, or the like for operating a BIST circuit of a semiconductor chip. Such a test signal may be transmitted to the test head 230 via wires or wirelessly.

The test main body 210 may receive and analyze a rest result regarding the multi-channel package 100, from the test head 230. The test main body 210 may include a processing device. For example, the test main body 210 may include a personal computer (PC), a desktop computer, a portable electronic device, a microprocessor, a microprocessor-based or programmable user electronic device, a mini-computer, a main frame computer, and/or a personal mobile computing device.

The test main body 210 may supply power to the test head 230 by including a power supply device. The test main body 210 may adjust a temperature of the test apparatus 200 by using a chiller. The test main body 210 may include a space where the multi-channel package 100 that is a test target is stored. According to an example embodiment, a region including only the power supply device or the chiller may be referred to as the test main body 210, and a processing device generating a test signal and analyzing a test result may be connected to the test main body 210 as a type of server.

The test head 230 may be electrically connected to a test target through the test board 220. The test target may be, for example, the multi-channel package 100. The test target of the test apparatus 200 is not limited to the multi-channel package 100. For example, a general package that does not employ a multi-channel or a semiconductor chip of a wafer level may also be a test target of the test apparatus 200. The test head 230 may transmit the test signal received from the test main body 210 to the test target, for example, the multi-channel package 100, through the test board 220. Also, the test head 230 may transmit a test result regarding the multi-channel package 100 received through the test board 220 to the test main body 210.

The test board 220 may be arranged on the test head 230, and the multi-channel package 100 that is the test target may be arranged on the test board 220. The multi-channel package 100 may be electrically connected to the test board 220 through the external connection member 115. Such a test board 220 may correspond to an interface board electrically connecting the multi-channel package 100 to the test head 230. For example, the test board 220 may be a type of printed circuit board (PCB) where wires for electrically connecting the test head 230 and the multi-channel package 100 are formed. The wires may include input and output test signal lines, clock signal lines, and power supply lines. According to an example embodiment, a high fidelity tester access fixture (HI FIX, so-called a mother board) may be arranged on the test head 230 instead of the test board 220.

The test board 220 may include a socket and a field programmable gate array (FPGA). An external connection member 150 of the multi-channel package 100 may be connected to each pin of the socket. The FPGA is provided to improve a function of the test apparatus 200 having low performance, and may perform substantially the same operation as BIST. For example, the FPGA may expand a system channel as a built-out self-test (BOST) chip, and may include a drive, a comparator, a power channel control block, etc. Also, the FPGA may convert a low-speed (less than 1 Gbpa) clock signal and a test pattern signal from the test main body 210 having low performance to have a high speed (for example, several Gbps), and directly apply the clock signal and the test pattern signal to the external connection member 115 of the multi-channel package 100. According to an example embodiment, the FPGA may not be included in the test board 220.

The test handler 240 automatically supplies the test target, i.e., the multi-channel package 100, on the test board 220, and after a test process, transfers the multi-channel package 100 to a suitable location according to a test result. The test handler 240 may be combined to the test main body 210 in 1:1 or N:1. In other words, one test handler 240 may exist per test main body 210, or a plurality of the test handlers 240 may exist per test main body 210. In general, the test handler 240 may include a loading unit, an input stage, a test site, a shuttle, an unloading unit, an output stage, and sensors.

For example, in some example embodiments, based on the result of the testing, the test apparatus 200 may selectively complete manufacturing the multi-channel package by instructing the test handler 240 to place the multi-channel package in the output stage.

In some example embodiments, based on the result of the testing, the test apparatus 200 may selectively incorporate the multi-channel package into an electronic device.

Figure 8:
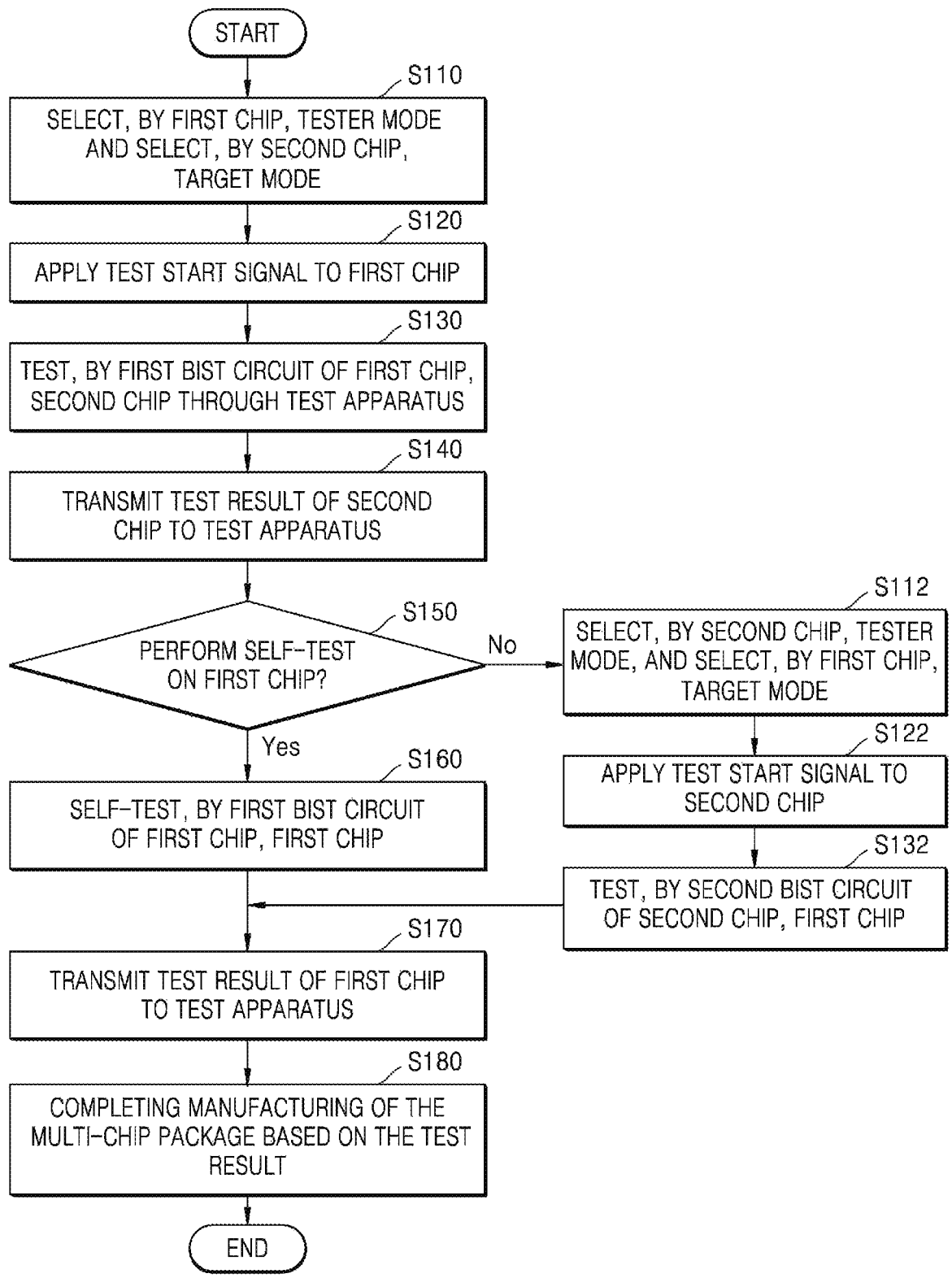
FIG. 8 is a flowchart of a test method of testing a multi-channel package, according to an example embodiment.

FIG. 8 is a flowchart of a test method of testing a multi-channel package, according to an example embodiment. The test method will be described with reference to FIGS. 2A through 7, and details that have been described above with reference to FIGS. 1A through 7 will be briefly described or omitted.

Referring to FIG. 8, in operation S110, the first chip 120-1 selects a tester mode, and the second chip 120-2 selects a target mode. The selecting of the tester mode and the selecting of the target mode may be performed when the test apparatus 200 respectively applies mode select signals to the MRS 124M of the first BIST circuit 124-1 of the first chip 120-1 and the MRS 124M of the second BIST circuit 124-2 of the second chip 120-2.

In operation S120, the test apparatus 200 applies a test start signal to the first chip 120-1 selected to be in the tester mode.

In operation S130, the first BIST circuit 124-1 of the first chip 120-1 tests the second chip 120-2 through the test apparatus 200. Here, the test apparatus 200 may denote, for example, the test board 220. Also, the testing of the second chip 120-2 may include testing of the second memory device 122-2 of the second chip 120-2 and a testing of a state on a path from the first chip 120-1 to the second chip 120-2. Operation S130 will be discussed in detail below with reference to FIG. 9.

The first BIST circuit 124-1 of the first chip 120-1 transmits a test result of the second chip 120-2 to the test apparatus 200, in operation S140. The test result of the second chip 120-2 may be temporarily stored in a buffer, and then transmitted to the test apparatus 200.

In operation S150, it is determined whether to perform a self-test on the first chip 120-1.

When it is determined to perform the self-test (Yes), in operation S160, the first BIST circuit 124-1 of the first chip 120-1 performs the self-test on the first chip 120-1.

In operation S170, the first BIST circuit 124-1 of the first chip 120-1 transmits a test result of the first chip 120-1 to the test apparatus 200. Meanwhile, when the test result of the second chip 120-2 is stored in the buffer, the test result of the second chip 120-2 may also be transmitted to the test apparatus 200.

When it is determined not to perform the self-test (No), in operation S112, the second chip 120-2 selects a tester mode and the first chip 120-1 selects a target mode. The selecting of the tester mode and the selecting of the target mode may also be performed when the test apparatus 200 applies a respective mode select signal to the MRS 124M of the BIST circuit 124 of the semiconductor chip 120.

In operation S122, a test start signal is applied to the second chip 120-2 selected to be in the tester mode. In operation S132, the second BIST circuit 124-2 of the second chip 120-2 tests the first chip 120-1 through the test apparatus 200.

Then, in operation S170, the second BIST circuit 124-2 of the second chip 120-2 transmits the test result of the first chip 120-1 to the test apparatus 200.

In some example embodiments, in operation S180, based on the result of the testing, the test apparatus 200 may selectively complete manufacturing the multi-channel package by instructing the test handler 240 to place the multi-channel package in the output stage. Further, in some example embodiments, based on the result of the testing, the test apparatus 200 may selectively incorporate the multi-channel package into an electronic device.

Figure 9:
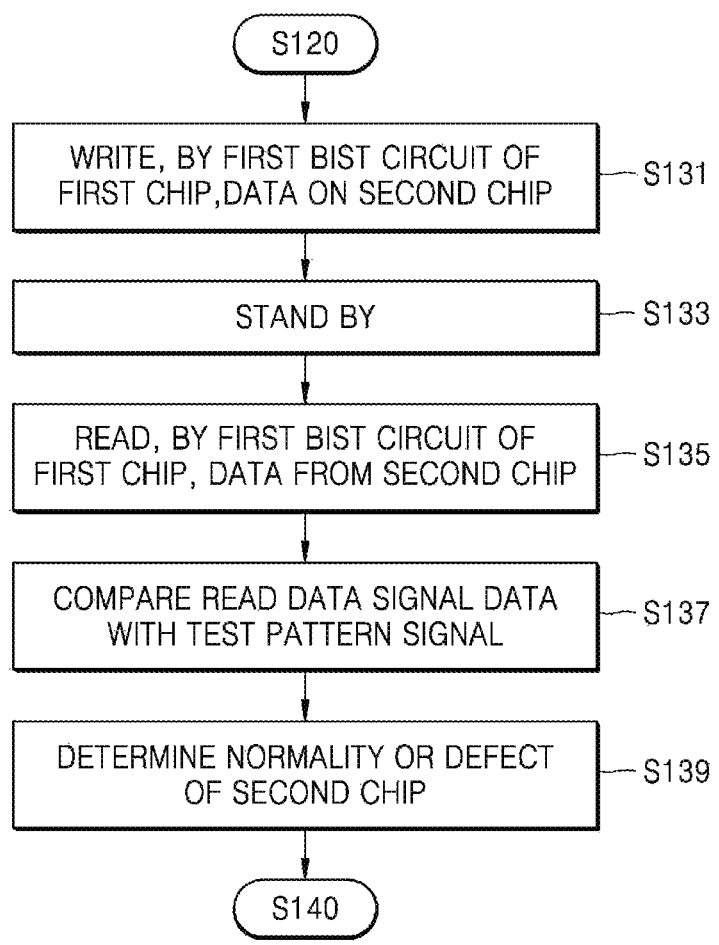
FIG. 9 is a flowchart illustrating testing, performed by a first BIST circuit of a first chip, a second chip of FIG. 8 in detail.

FIG. 9 is a flowchart illustrating the testing, performed by the first BIST circuit 124-1 of the first chip 120-1, of the second chip 120-2 of FIG. 8 in detail. The testing will be described with reference to FIGS. 2A through 7, and details that have been described above with reference to FIG. 8 will be briefly described or omitted.

Referring to FIG. 9, in operation S131, when the test start signal is applied to the first BIST circuit 124-1 of the first chip 120-1, the first BIST circuit 124-1 of the first chip 120-1 writes data by applying a test pattern signal to the second chip 120-2.

In operation S133, the first BIST circuit 124-1 stands by for a set period of time. A standby time may be determined based on a type of a memory device, such that data storage performance is optimally tested. Accordingly, the standby time may vary according to types of memory device.

In operation S135, the first BIST circuit 124-1 of the first chip 120-1 reads data or data signal from the second chip 120-2.

In operation S137, the data signal read from the second chip 120-2 is compared with the test pattern signal that has been initially applied.

In operation S139, based on a result of the comparing, normality or defect of the second chip 120-2 is determined.

Meanwhile, a self-test of the first chip 120-1 by the first BIST circuit 124-1 of the first chip 120-1 (operation S160) and a test of the first chip 120-1 by the second BIST circuit 124-2 of the second chip 120-2 (operation S132) may be performed in the similar manner. For example, when the first chip 120-1 is self-tested, the first BIST circuit 124-1 of the first chip 120-1 may write data by applying a test pattern signal to the first chip 120-1, stand by for a set period of time, read data signal from the first chip 120-1, compare the data signal read from the first chip 120-1 with the test pattern signal initially applied, and determine whether the first chip 120-1 is normal or defective based on a result of the comparing. In addition, the testing of the first chip 120-1 by the second BIST circuit 124-2 of the second chip 120-2 may be performed by changing the roles of the first chip 120-1 and the second chip 120-2 in the testing of the second chip 120-2 by the first BIST circuit 124-1 of the first chip 120-1.

The test method of FIGS. 8 and 9 may correspond to the inter-channel cross test described above with reference to FIGS. 6A, 6B, and 6D.

Figure 10:
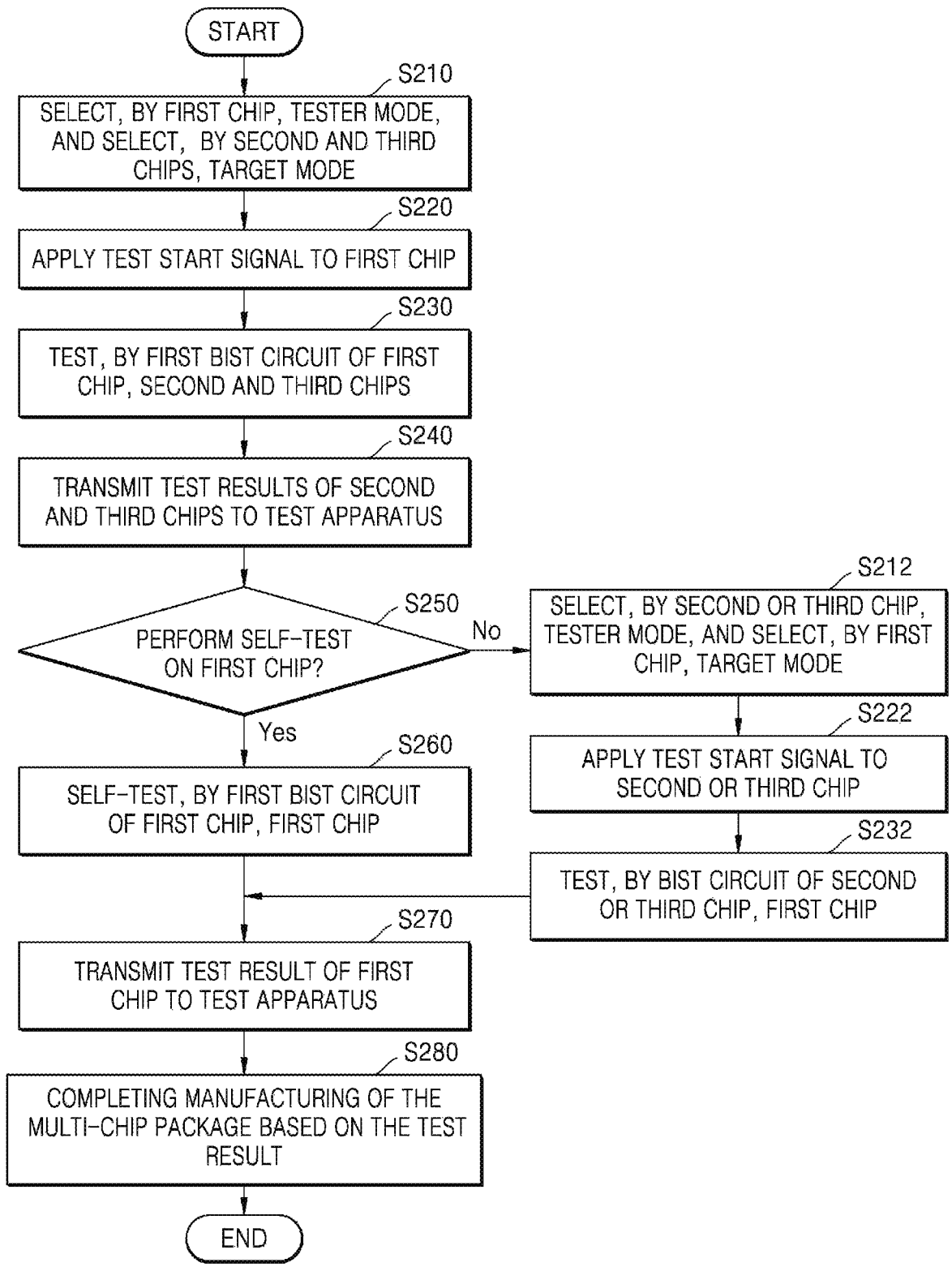
FIG. 10 is a flowchart of a test method of testing a multi-channel package, according to another example embodiment.

FIG. 10 is a flowchart of a test method of testing a multi-channel package, according to another example embodiment. The test method will be described with reference to FIGS. 4A though 4C and 7, and details that have been described above with reference to FIGS. 8 and 9 will be briefly described or omitted.

Referring to FIG. 10, in operation S210, the first chip 120-1 selects a tester mode and the second and third chips 120-2 and 120-3 select a target mode.

In operation S220, a test start signal is applied to the first chip 120-1 selected to be in the tester mode.

In operation S230, the first BIST circuit 124-1 of the first chip 120-1 tests the second and third chips 120-2 and 120-3 through the test apparatus 200. Here, the testing of the second and third chips 120-2 and 120-3 may include the testing of memory devices of the second and third chips 120-2 and 120-3 and testing of states of paths from the first chip 120-1 to the second chip 120-2 and from the first chip 120-1 to the third chip 120-3.

In operation S240, the first BIST circuit 124-1 of the first chip 120-1 transmits test results of the second and third chips 120-2 and 120-3 to the test apparatus 200. The test results of the second and third chips 120-2 and 120-3 may be temporarily stored in a buffer and then transmitted to the test apparatus 200.

In operation S250, it is determined whether to perform a self-test on the first chip 120-1. When it is determined to perform the self-test (Yes), in operation S260, the first BIST circuit 124-1 of the first chip 120-1 performs the self-test on the first chip 120-1.

In operation S270, the first BIST circuit 124-1 of the first chip 120-1 transmits a test result of the first chip 120-1 to the test apparatus 200. Meanwhile, when the test results of the second and third chips 120-2 and 120-3 are stored in the buffer, the test results of the second and third chips 120-2 and 120-3 may also be transmitted to the test apparatus 200.

When it is determined not to perform the self-test (No), in operation S212, the second or third chip 120-2 or 120-3 selects a tester mode and the first chip 120-1 selects a target mode. In operation S222, a test start signal is applied to the second or third chip 120-2 or 120-3 selected to be in the tester mode. In operation S232, a BIST circuit of the second or third chip 120-2 or 120-3 tests the first chip 120-1 through the test apparatus 200.

In operation S270, the BIST circuit of the second or third chip 120-2 or 120-3 transmits the test result of the first chip 120-1 to the test apparatus 200.

In some example embodiments, in operation S280, based on the result of the testing, the test apparatus 200 may selectively complete manufacturing the multi-channel package by instructing the test handler 240 to place the multi-channel package in the output stage. Further, in some example embodiments, based on the result of the testing, the test apparatus 200 may selectively incorporate the multi-channel package into an electronic device.

The test method of FIG. 10 may correspond to the inter-channel cross test described above with reference to FIG. 6C.

While the inventive concepts has been particularly shown and described with reference to embodiments thereof, it will be understood that various changes in form and details may be made therein without departing from the spirit and scope of the following claims.

What is claimed is:

1. A multi-channel package comprising:
a package substrate including an external signal path; and
at least two semiconductor chips mounted on the package substrate and having different channels, each of the at least two semiconductor chips including a built-in-self-test (BIST) circuit, each of the at least two semiconductor chips configured to perform a test by operating in a selected one of a self-test mode, a tester mode, and a target mode such that, in the tester mode and the target mode, the at least two semiconductor chips are inter-channel cross-testable through the external signal path.

2. The multi-channel package of claim 1, wherein
the multi-channel package is electrically connected to a test board of a test apparatus for testing the multi-channel package, through an external connection member of the package substrate during the test, and
in the tester mode and the target mode, the at least two semiconductor chips are inter-channel cross-tested through the test board.

3. The multi-channel package of claim 1, wherein the BIST circuit comprises:
a mode register set (MRS) configured to store a mode; and
processing circuitry configured to,
generate a test pattern signal,
compare a read data signal with the test pattern signal to generate a comparison result, and
determine normality or defect of a chip according to the comparison result.

4. The multi-channel package of claim 1, wherein, the BIST circuit of a first chip among the at least two semiconductor chips tests a second chip among the at least two semiconductor chips in response to a test start signal being applied to the first chip, when the first chip is set to the tester mode and the second chip is set to the target mode.

5. The multi-channel package of claim 4, wherein the BIST circuit of the first chip tests the second chip by,
sequentially transmitting a test pattern signal from the BIST circuit of the first chip to a chip pad of the first chip, a first external connection member of the package substrate, a test board of a test apparatus, a second external connection member of the package substrate, a chip pad of the second chip, and a memory device of the second chip, and
testing a first state between the chip pad of the first chip and the first external connection member and a second state between the second external connection member and the chip pad of the second chip.

6. The multi-channel package of claim 1, wherein the multi-channel package has stacked structure in which two or more of the at least two semiconductor chips are stacked on the package substrate, the stacked structure having a single channel or at least two channels according to a design of a respective one of the at least two semiconductor chips included in the stacked structure.

7. The multi-channel package of claim 1, wherein the multi-channel package has a structure in which one of,
the at least two semiconductor chips are spaced apart from each other in a horizontal direction on the package substrate, or
the at least two semiconductor chips form a plurality of stacked structures and the plurality of stacked structures are spaced apart from each other in the horizontal direction on the package substrate.

8. The multi-channel package of claim 1, wherein each of the at least two semiconductor chips include a switching device configured to change a signal path to a testing apparatus based on whether a respective one of at least two semiconductor chips are operating in the self-test mode and target mode.

9. A test apparatus comprising:
a test body configured to generate a test signal to test a multi-channel package, the multi-channel package including at least two semiconductor chips having different channels, each of the at least two semiconductor chips including a built-in-self-test (BIST) circuit, the at least two semiconductor chips configured to operate in a selected one of a self-test mode, a tester mode, and a target mode during a test such that, in the tester mode and the target mode, the at least two semiconductor chips are inter-channel cross-testable;
a test board electrically connected to the at least two semiconductor chips of the multi-channel package to allow the test apparatus to perform an inter-channel cross-test;
a test head configured to transmit the test signal from the test body to the test board; and
a test handler configured to provide the multi-channel package to the test board, and to transfer the multi-channel package to a set location according to a test result.

10. The test apparatus of claim 9, wherein
the multi-channel package includes a package substrate having the at least two semiconductor chips mounted thereto, and an external connection member, and
during the test, the at least two semiconductor chips are electrically connected to the test board through the external connection member such that, in the tester mode and the target mode, the test apparatus performs the inter-channel cross-test through the test board.

11. The test apparatus of claim 9, wherein, the BIST circuit of a first chip among the at least two semiconductor chips tests a second chip among the at least two semiconductor chips in response to the first chip being set to the tester mode and the second chip being set to the target mode.

12. The test apparatus of claim 11, wherein the BIST circuit of the first chip tests the second chip by,
sequentially transmitting a test pattern signal from the BIST circuit of the first chip to a chip pad of the first chip, a first external connection member of a package substrate, the test board, a second external connection member of the package substrate, a chip pad of the second chip, and a memory device of the second chip, and
testing a first state between the chip pad of the first chip and the first external connection member and a second state between the second external connection member and the chip pad of the second chip.

13. The test apparatus of claim 11, wherein, after the second chip is tested,
the first chip is set to the self-test mode, and the BIST circuit of the first chip self-tests the first chip, or
the second chip is set to the tester mode and the first chip is set to the target mode, and the BIST circuit of the second chip tests the first chip.

14. The test apparatus of claim 9, wherein the test signal is applied to one semiconductor chip per channel of the test apparatus or the test signal is applied to a plurality of semiconductor chips per channel of the test apparatus.

15. The test apparatus of claim 9, wherein an operation speed of the at least two semiconductor chips is faster than an operation speed of the test apparatus.

16. The test apparatus of claim 9, wherein the multi-channel package has a stacked structure in which two or more of the at least two semiconductor chips are stacked on a package substrate, the stacked structure having a single channel or has at least two channels according to a design of a respective one of the at least two semiconductor chips included in the stacked structure.

* * * * *